(12) United States Patent
Nishihori et al.

(10) Patent No.: US 10,347,655 B2
(45) Date of Patent: Jul. 9, 2019

(54) SEMICONDUCTOR SWITCH

(71) Applicant: KABUSHIKI KAISHA TOSHIBA, Tokyo (JP)

(72) Inventors: Kazuya Nishihori, Shibuya Tokyo (JP); Keita Masuda, Kawasaki Kanagawa (JP); Tooru Suga, Yokohama Kanagawa (JP); Takahiro Nakagawa, Kawasaki Kanagawa (JP); Kazuhiko Shibata, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 15/410,346

(22) Filed: Jan. 19, 2017

(65) Prior Publication Data

US 2017/0213848 A1 Jul. 27, 2017

(30) Foreign Application Priority Data

Jan. 22, 2016 (JP) .................................. 2016-010950

(51) Int. Cl.
*H01L 27/12* (2006.01)
*H01L 29/78* (2006.01)
(Continued)

(52) U.S. Cl.
CPC ........ *H01L 27/1203* (2013.01); *H01L 29/665* (2013.01); *H01L 29/7843* (2013.01); *H01L 29/41733* (2013.01); *H01L 29/41758* (2013.01)

(58) Field of Classification Search
CPC .............. H01L 27/1203; H01L 29/665; H01L 29/7843; H01L 29/0847; H01L 29/7848; H01L 29/41758
See application file for complete search history.

(56) References Cited

U.S. PATENT DOCUMENTS

| | | |
|---|---|---|
| 6,949,443 B2 | 9/2005 | Ke et al. |
| 6,963,115 B2 | 11/2005 | Nakata et al. |

(Continued)

FOREIGN PATENT DOCUMENTS

| | | |
|---|---|---|
| JP | 2003060076 A | 2/2003 |
| JP | 2004172461 A | 6/2004 |

(Continued)

OTHER PUBLICATIONS

Shin-Ichi Takagi et al., Comparative study of phonon-limited mobility of two-dimensional electrons in strained and unstrained Si metal-oxide-semiconductor field-effect transistors, Journal of Applied Physics, Aug. 1, 1996, pp. 1567-1577, vol. 80, No. 3.
Toshishige Yamada et al., In-Plane Transport Properties of Si/Si1-xGex Structure and its FET Performance by Computer Simulation, IEEE Transactions on Electron Devices, Sep. 1994, pp. 1513-1522, vol. 41, No. 9.

(Continued)

*Primary Examiner* — Jung Kim
(74) *Attorney, Agent, or Firm* — Kim & Stewart LLP

(57) ABSTRACT

A radio frequency switch includes a switch circuit having switchable radio frequency (RF) signal pathways. Each switchable RF signal pathway comprises a plurality of n-type MOSFETs connected in series. A control circuit is configured to control a conduction state of the plurality of switchable RF signal pathways. Each n-type MOSFET includes a body region between a source region thereof and a drain region thereof. A gate electrode is on the body region. A silicon nitride film having a tensile internal stress covers the source layer, the drain layer, and the gate electrode.

11 Claims, 12 Drawing Sheets

(51) Int. Cl.
*H01L 29/66* (2006.01)
*H01L 29/417* (2006.01)

(56) References Cited

U.S. PATENT DOCUMENTS

| | | | |
|---|---|---|---|
| 7,488,690 | B2 | 2/2009 | Iyer et al. |
| 7,994,072 | B2 | 8/2011 | Hohage et al. |
| 8,390,127 | B2 * | 3/2013 | Wei .................. H01L 21/76816 |
| | | | 257/774 |
| 8,674,415 | B2 * | 3/2014 | Sugiura ............. H01L 29/41758 |
| | | | 257/213 |
| 8,786,002 | B2 | 7/2014 | Kondo et al. |
| 9,082,875 | B2 | 7/2015 | Balch et al. |
| 9,219,077 | B2 | 12/2015 | Yokoyama |
| 9,634,094 | B1 * | 4/2017 | Venkitachalam ............................ |
| | | | H01L 27/10897 |
| 2003/0040158 | A1 | 2/2003 | Saitoh |

FOREIGN PATENT DOCUMENTS

| | | | |
|---|---|---|---|
| JP | 2007173356 A | 7/2007 |
| JP | 2008506262 A | 2/2008 |
| JP | 2010232662 A | 10/2010 |
| JP | 2011502359 A | 1/2011 |
| JP | 2011108692 A | 6/2011 |
| JP | 2012015608 A | 1/2012 |
| JP | 2012134251 A | 7/2012 |
| JP | 2012216776 A | 11/2012 |
| JP | 5512498 B2 | 6/2014 |
| WO | 2016067584 A1 | 5/2016 |

OTHER PUBLICATIONS

H. Aikawa et al., Variability Aware Modeling and Characterization in Standard Cell in 45 nm CMOS with Stress Enhancement Technique, 2008 Symposium on ULSI Technology, Digest of Technical Papers, Jun. 17, 2008, pp. 90-91.
Robert H. Dennard et al., Design of Ion-Implanted MOSFET's with Very Small Physical Dimensions, IEEE Journal of Solid-State Circuits, Oct. 1974, pp. 256-268, vol. 9, No. 5.
Geert Eneman et al., Scalability of Stress Induced by Contact-Etch-Stop Layers: A Simulation Study, IEEE Transactions on Electron Devices, Jun. 2007, pp. 1446-1453, vol. 54, No. 6.
Mark R. Pinto et al., Silicon MOS Transconductance Scaling into the Overshoot Regime, IEEE Electron Device Letters, Aug. 1993, pp. 375-378, vol. 14, No. 8.
Hisayo Sasaki Momose et al., Relationship Between Mobility and Residual-Mechanical-Stress as Measured by Raman Spectroscopy for Nitrided-Oxide-Gate Mosfets, IEDM 90, Technical Digest, IEEE International, Dec. 1990, pp. 65-68.
A. Oishi et al., High Performance CMOSFET Technology for 45nm Generation and Scalability of Stress-Induced Mobility Enhancement Technique, IEDM 2005, Technical Digest, IEEE International, Dec. 2005, pp. 239-242.
S. Pidin et al., A Novel Strain Enhanced CMOS Architecture Using Selectively Deposited High Tensile and High Compressive Silicon Nitride Films, IEDM 2004, Technical Digest, IEEE International, Dec. 2004, pp. 213-216.
Japanese Office Action dated Apr. 25, 2018, filed in Japanese counterpart Application No. 2016-010950, 8 pages (with translation).

* cited by examiner

SEMICONDUCTOR SWITCH

CROSS-REFERENCE TO RELATED APPLICATION

This application is based upon and claims the benefit of priority from Japanese Patent Application No. 2016-010950, filed Jan. 22, 2016, the entire contents of which are incorporated herein by reference.

FIELD

Embodiments described herein relate generally to radio frequency (RF) switches.

BACKGROUND

In a mobile communication device, such as a cellular phone and the like, radio frequency signals are transmitted and received via antenna terminals, and a radio frequency switch is provided to handle the switching between signals. The radio frequency switch includes a switch circuit, which switches paths of the radio frequency signals, and a control circuit which controls the switch circuit. Recently, n-type MOSFETs (Metal Oxide Semiconductor Field Effect Transistors) have been used in the switch circuit.

However, an insertion loss may increase when these n-type MOSFETs have a high on-resistance.

DETAILED DESCRIPTION

The radio frequency switch according to the present embodiment includes a switch circuit having a plurality of switchable radio frequency signal pathways, each switchable radio frequency signal pathway comprises a plurality of n-type MOSFETs connected in series. A control circuit is configured to control a conduction state of the plurality of switchable radio frequency signal pathways. Each n-type MOSFET comprises a body region between a source region thereof and a drain region thereof, a gate electrode on the body region, and a silicon nitride film having a tensile internal stress and covering the source layer, the drain layer, and the gate electrode.

Example embodiments will now be explained with reference to the accompanying drawings. The present disclosure is not limited to the present examples. In one example embodiment, a radio frequency switch having a reduced insertion loss is provided.

Figures 1A, 1B, 1C:
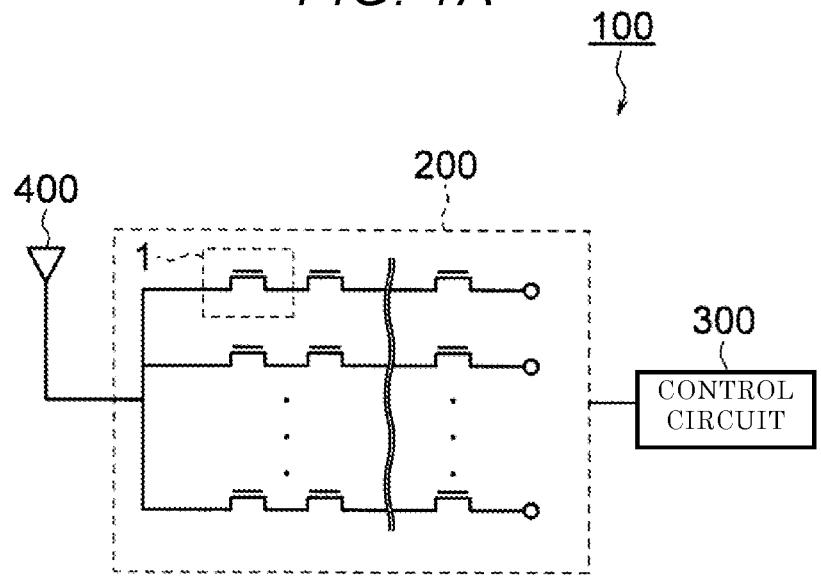
FIG. 1A is a schematic block diagram of a radio frequency switch according to an embodiment.
FIG. 1B is an equivalent circuit diagram of an on-state path of the radio frequency switch shown in FIG. 1A.
FIG. 1C is an equivalent circuit diagram of an off-state path of the radio frequency switch shown in FIG. 1A.

FIG. 1A is a block diagram showing a schematic configuration of a radio frequency switch according to an embodiment. As shown in FIG. 1A, a radio frequency switch 100 includes a switch circuit 200 and a control circuit 300.

The switch circuit 200 is used for switching paths for radio frequency signals which are transmitted to or received from an antenna 400. A frequency of the radio frequency signals is 700 MHz or more and its electrical power is 20 dBm or more. The switch circuit 200 includes a plurality of semiconductor devices 1 connected in series for each of paths of the radio frequency signals. The plurality of semiconductor devices 1 are each provided with an n-type metal-oxide-semiconductor field-effect transistor (MOSFET).

The control circuit 300 is provided with a variety of electronic components (such as a MOSFET) so as to control a gate voltage of the plurality of semiconductor devices 1. The plurality of semiconductor devices 1 are switched between on-state and off-state based on control by the control circuit 300 and thereby the paths of the radio frequency signals are switched.

FIG. 1B is an equivalent circuit diagram showing a path for the radio frequency signals through one possible signal path in an on-state in the radio frequency switch shown in FIG. 1A. As shown in FIG. 1B, both ends of the plurality of the semiconductor devices 1 connected in series are connected to a resistor of 50Ω. One end of the plurality of semiconductor devices 1 is connected to a power source Vrf having a frequency of 2 GHz through a resistor of 50Ω. In the circuit shown in FIG. 1B, each of semiconductor devices 1 in on-state is equivalent to a resistance component Ron. That is, the semiconductor devices 1 in FIG. 1B are represented as equivalent resistors having a resistance value of Ron (on-state resistance of semiconductor device 1). The resistance component Ron is very much lower than 50Ω, which makes a voltage difference between drain and source of each of semiconductor devices 1 very low.

FIG. 1C is an equivalent circuit diagram showing the signal path for the radio frequency signals when the semiconductor devices of one possible path (e.g., the one depicted in FIG. 1B) are in an off-state while another signal path (see FIG. 1A) is in an on-state. a). As shown in FIG. 1C, each of semiconductor devices 1 in off-state is equivalent to a capacitor component Coff. Each of components Coff is applied with a high voltage unlike the resistance component Ron in on-state. Therefore, each of semiconductor devices 1 requires a high withstand voltage to effectively maintain the off-state.

Figure 2:
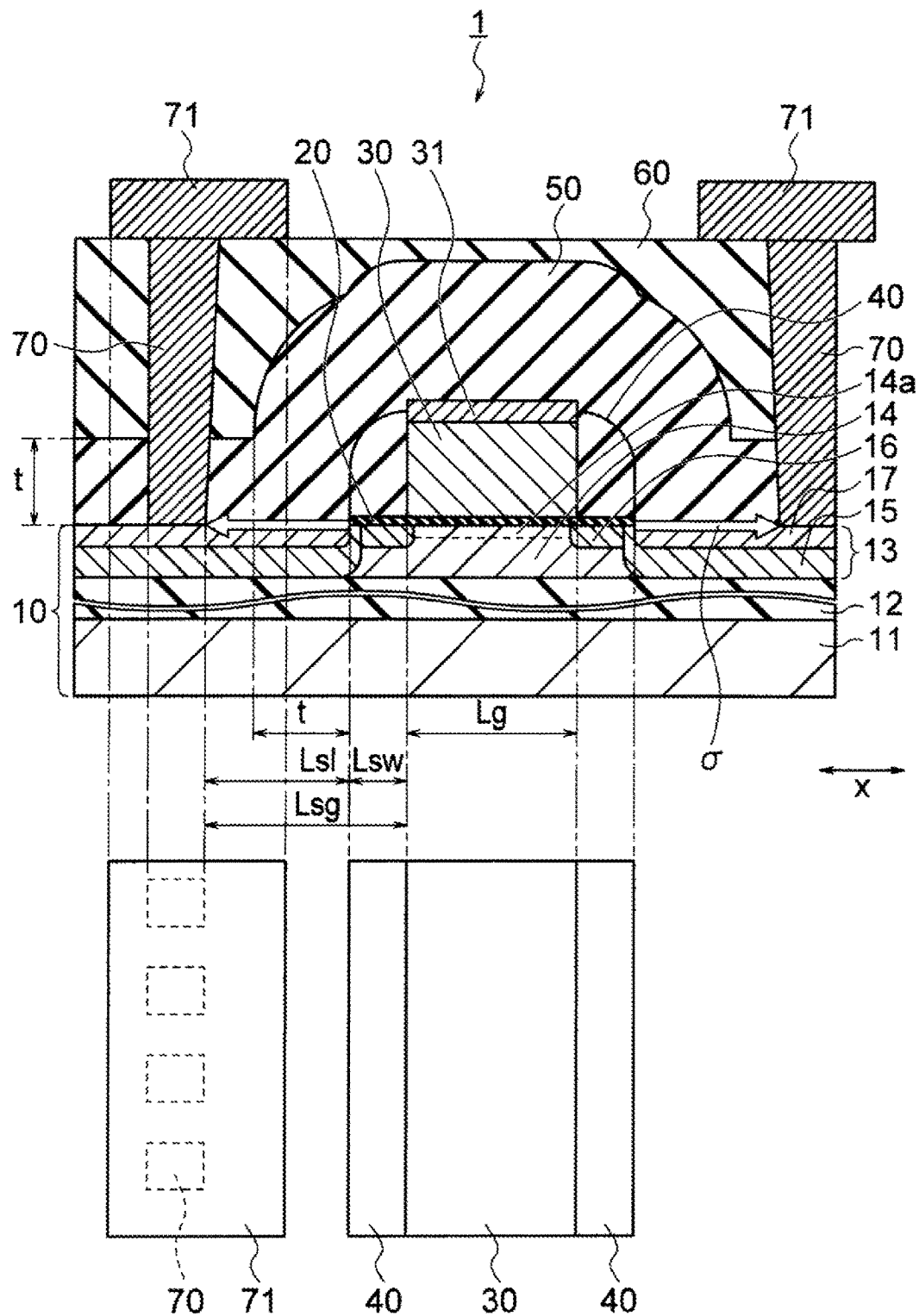
FIG. 2 is a schematic cross-sectional view and a schematic plain view showing a major part of a semiconductor device of the radio frequency switch according to the embodiment.

FIG. 2 is a schematic cross-sectional view and a schematic plan view showing aspects of the semiconductor device 1 in the radio frequency switch according to the present embodiment. As shown in FIG. 2, the semiconductor device 1 includes a silicon-on-insulator substrate 10 (SOI substrate 10), a gate insulating film 20, a gate electrode 30, sidewall insulating film(s) 40, a conformal insulating film 50, an interlayer insulating film 60, and contact plugs 70.

The SOI substrate 10 includes a support substrate 11, a buried oxide layer 12 (hereinafter, BOX layer 12), and a SOI layer 13. The support substrate 11 is formed of, for example, a silicon substrate. The BOX layer 12 is formed of an insulating layer, for example, a silicon oxide film (such as $SiO_2$ film) and is provided on the support substrate 11. The SOI layer 13 is provided on the BOX layer 12.

The SOI layer 13 includes a first semiconductor layer 14, a second semiconductor layer 15, an extension layer 16, and a silicide layer 17. The second semiconductor layer 15, the extension layer 16, and the silicide layer 17 are each provided symmetrically on both sides of the first semiconductor layer 14.

The first semiconductor layer 14 is a body region doped with acceptor impurities. A surface portion (a portion proximate to the upper surface) of the first semiconductor layer 14 forms a channel region 14a when the gate electrode 30 is applied with a predetermined (threshold) voltage. The second semiconductor layer 15 is an n-type semiconductor layer doped with donor impurities. The semiconductor layer 15 serves as a source layer and a drain layer of the n-type MOSFET.

The extension layer 16 is closer to the gate electrode 30 than is the second semiconductor layer 15. A concentration of the donor impurities in the extension layer 16 is lower than a concentration of the donor impurities in the second semiconductor layer 15. And a thickness of the extension layer 16 is smaller than a thickness of the second semiconductor layer 15.

The silicide layer 17 is provided on the second semiconductor layer 15. The silicide layer 17 is formed of a compound including silicon and a high melting metal such as Tungsten (W), Molybdenum (Mo), Cobalt (Co), and Nickel (Ni).

The gate insulating film 20, also referred to as a first insulating film, is provided on the first semiconductor layer 14. The gate insulating film 20 is formed of a silicon oxide, for example.

The gate electrode 30 is on the gate insulating film 20 and formed of polysilicon, for example. A gate length Lg of the gate electrode 30 is longer than 100 nm and shorter than 300 nm. The silicide layer 31 is provided on the gate electrode 30. The silicide layer 31 is formed of a compound including silicon and a high melting metal, such as described for the silicide layer 17.

The sidewall insulating film 40 is provided on both sides of the gate electrode 30 and extends from the sidewalls of the gate electrode 30 for a maximum distance Lsw towards the second semiconductor layer 15. The sidewall insulating film 40 is used as a mask for patterning the second semiconductor layer 15.

The conformal insulating film 50, also referred to as a second insulating film, is provided to cover the second semiconductor layer 15, the gate electrode 30, and the sidewall insulating film 40. The conformal insulating film 50 is formed of a silicon nitride (SiN) film. In the present embodiment, the conformal insulating film 50 has an internal tensile stress σ acting in a current direction x (a channel length direction) of the channel region 14a. The channel region 14a is pulled in the current direction x by the internal tensile stress σ.

In the present embodiment, the internal tensile stress σ of the conformal insulating film 50 is between 1 GPa and 3 GPa. A thickness t of the conformal insulating film 50 is larger than the width Lsw of the sidewall insulating film 40. For example, the thickness t of the conformal insulating film 50 is 70 nm or more.

The interlayer insulating film 60, which is provided on the conformal insulating film 50, is formed of a silicon oxide film, for example.

The contact plugs 70 are electrically contacting the second semiconductor layer 15 and pass through the interlayer insulating film 60 and the conformal insulating film 50. The contact plug 70 serves as a drain electrode when the second semiconductor layer 15 serves as a drain layer and a source electrode when the second semiconductor layer 15 serves as a source layer. The second semiconductor layer 15 (the source/drain layer) is electrically connected, through the contact plug 70, to a wiring 71 provided on the interlayer insulating film 60.

Figure 3:
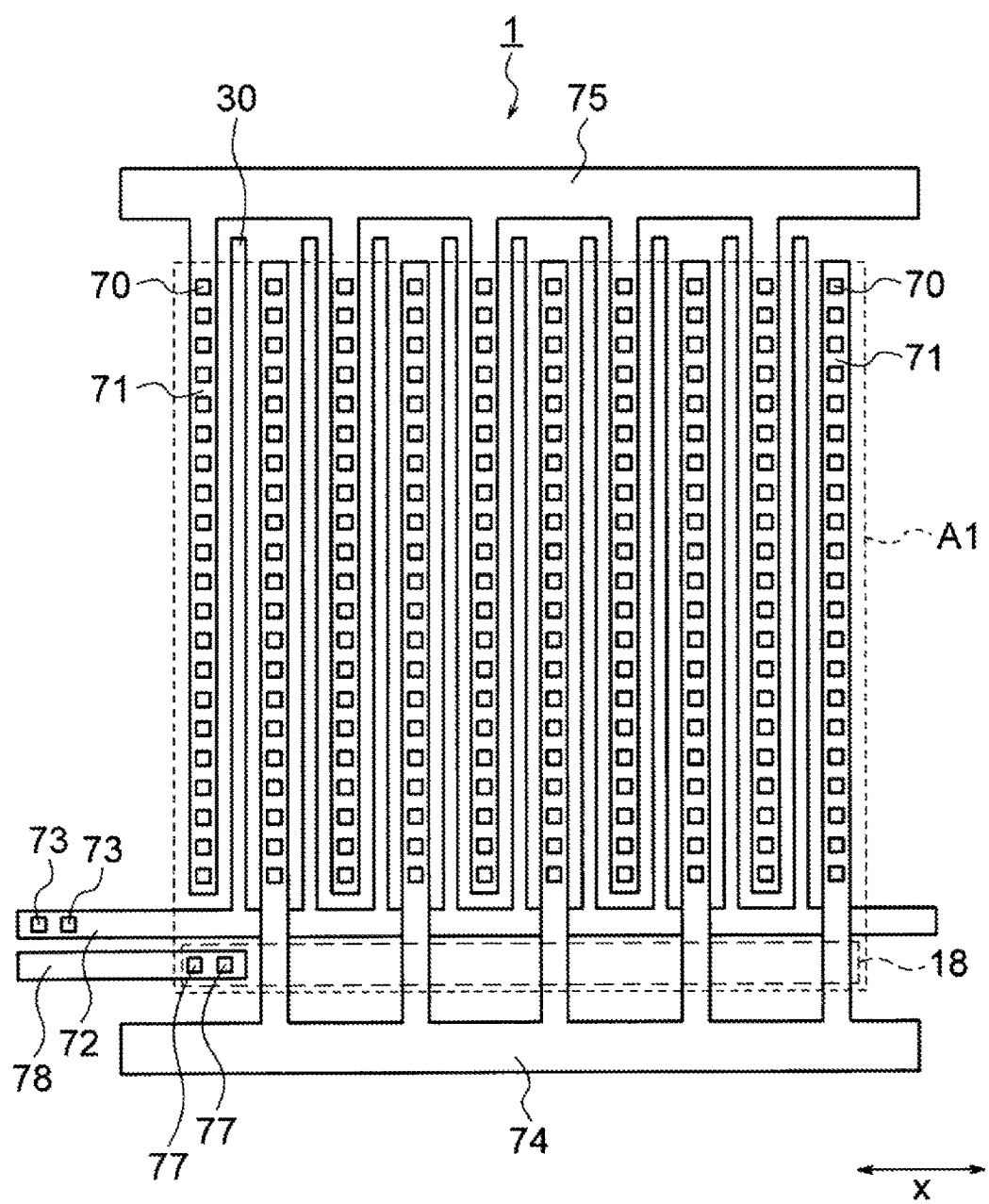
FIG. 3 is a plan view showing a layout of the semiconductor device of the radio frequency switch according to the embodiment.

FIG. 3 is a plan view showing a layout of the semiconductor device 1 of the radio frequency switch according to the present embodiment. The depicted layout of the semiconductor device 1 is in the form of what is called a multi-finger type.

Specifically, a plurality of gate electrodes 30 are arranged in the current direction x and connected to a wiring 72 in an active area A1. The plurality of gate electrodes 30 and a wiring 72 form a comb shape. Contact plugs 73 are electrically connected to the wiring 72. The plurality of gate electrodes 30 are electrically connected to the outside by the wiring 72 and the contact plugs 73. The semiconductor device 1 has a T-shaped gate in which one end of the gate electrode 30 is connected to the wiring 72. The semiconductor device 1 may also have an H-shaped gate which both ends of the gate electrode 30 are connected to wirings 72, respectively.

A plurality of wirings 71 are alternately arranged with the gate electrodes 30 in the current direction x in the active area A1. And the plurality of wirings 71 are connected to a wiring 74, or a wiring 75 having a potential level different from that of the wiring 74, and form a comb shape with the wiring 74 or the wiring 75.

Furthermore, the semiconductor device 1 includes $P^+$ region 18, body electrodes 77, and a wiring 78 for controlling an electrical potential of the first semiconductor layer 14.

The $P^+$ region 18 is arranged in an end portion of the active region A1 in a longitudinal direction of the gate electrode 30 (the longitudinal direction is a direction crossing the current direction x), and in contact with the first semiconductor layer 14 in the longitudinal direction of the gate electrode. The body electrodes 77 are provided on the P+ region 18 and are positioned on the outside (beyond) the wiring 72, that is, the body electrodes 77 are closer to a STI (shallow-trench-isolation) region or the end portion of the active area A1 than the wiring 72 in the longitudinal direction of the gate electrode 30. The body electrodes 77 connect the $P^+$ region 18 and the wiring 78. The wiring 78 does not cross the wiring 71, the wiring 74, or the wiring 75, and is spaced apart from the wiring 71, the wiring 74, and the wiring 75 in the plan view. One portion of the wiring 78 is located immediately above the end portion of the active region A1. The end portion of the active region A1 herein, is located in the longitudinal direction of the gate electrode 30 and includes the P+ region 18.

Hereinafter, aspects of manufacturing the semiconductor device (s) according to the present embodiment are described with reference to FIG. 4 to FIG. 11.

Figure 4:
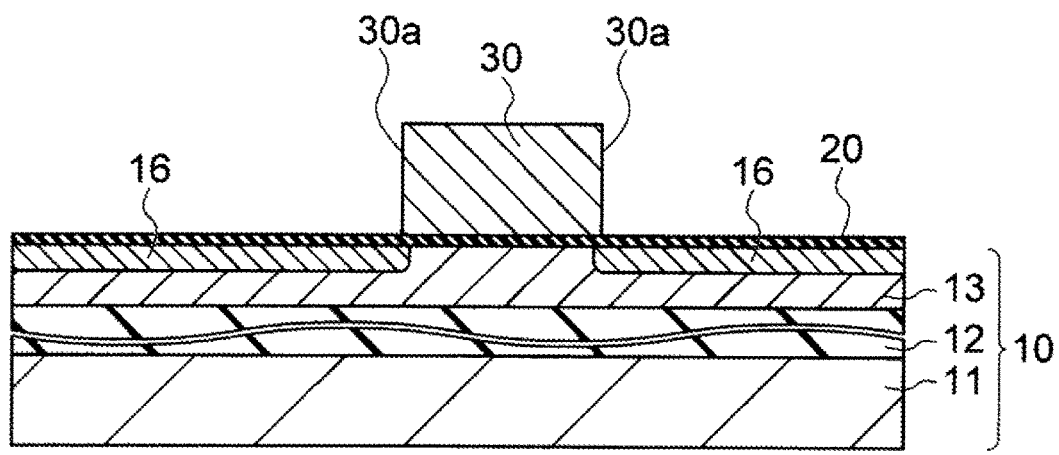
FIG. 4 is a cross-sectional view depicting fabrication processes up to formation of an extension layer.

FIG. 4 is a cross-sectional view describing fabrication up to forming the extension layer 16. First, the gate insulating film 20 is formed on the SOI substrate 10. Next, the gate electrode 30 is formed on the gate insulating film 20. Then, the extension layer 16 is formed in a self-aligned manner in the SOI layer 13 of the SOI substrate 10

Here, the thickness of the SOI layer 13 is approximately 50 nm to 100 nm. The thickness of the gate insulating film 20 is approximately 5 nm. The gate length Lg of the gate electrode 30 is approximately 200 nm.

Figure 5:
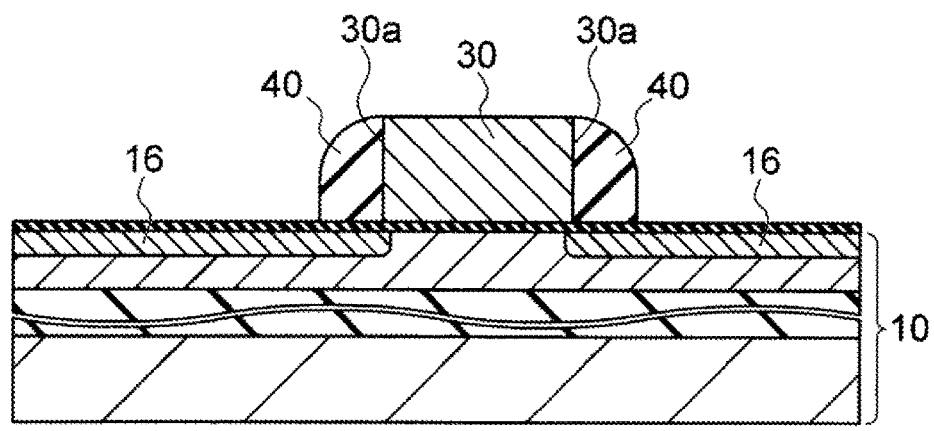
FIG. 5 is a cross-sectional view depicting a process of forming a sidewall insulating film.

FIG. 5 is a cross-sectional view showing formation of the sidewall insulating film 40. After forming the extension layer 16, the sidewall insulating film 40 is formed on a side surface 30a of the gate electrode 30. The width of the sidewall insulating film 40 along the current direction x is 70 nm or more.

Figure 6:
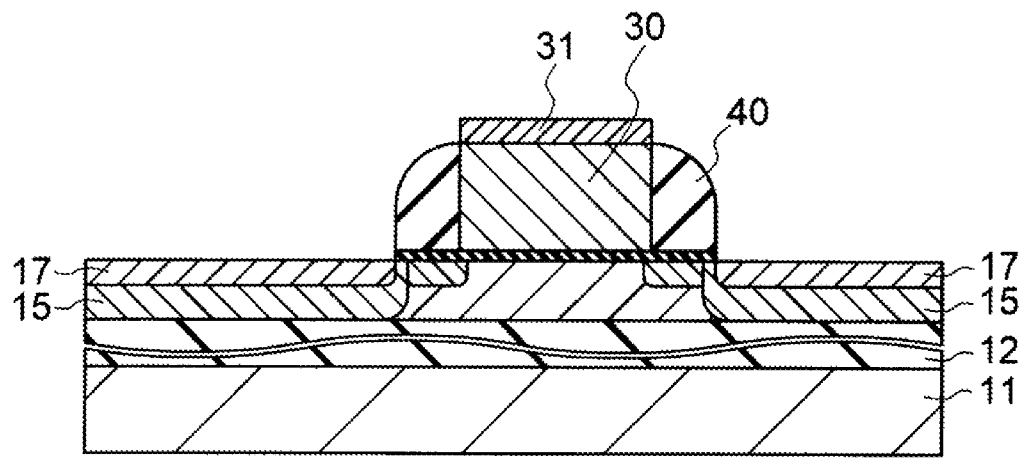
FIG. 6 is a cross-sectional view depicting a process of forming a second semiconductor layer and silicide layers.

FIG. 6 is a cross-sectional view showing forming of the second semiconductor layer 15 and silicide layers 17 and 31. After forming the sidewall insulating film 40, the second semiconductor layer 15 is formed on the SOI layer 13 in a self-aligned manner. After removing a part of the gate electrode 30, the silicide layer 17 is formed on the second semiconductor layer 15 in a self-aligned manner, and the silicide layer 31 is formed on the gate electrode 30 in a self-aligned manner at the same time.

Figure 7:
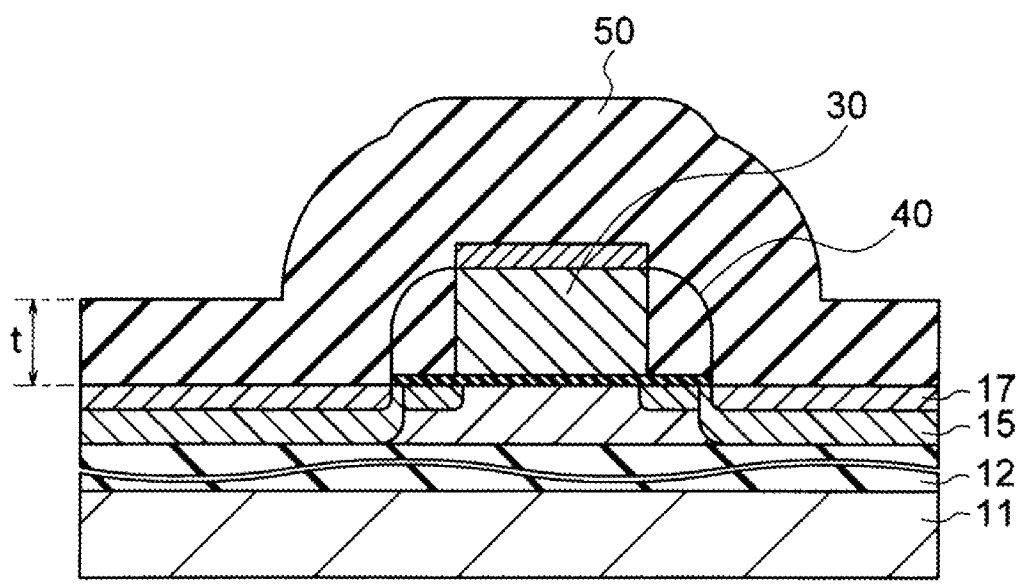
FIG. 7 is a cross-sectional view depicting a process of forming a conformal insulating film.

FIG. 7 is a cross-sectional view showing forming of the conformal insulating film 50. After forming the second semiconductor layer 15 and the silicide layers 17 and 31, the conformal insulating film 50 is formed by CVD (Chemical Vapor Deposition) apparatus so that the film thickness t is approximately 70 nm and the internal tensile stress is approximately 1 GPa to 3 GPa.

Figure 8:
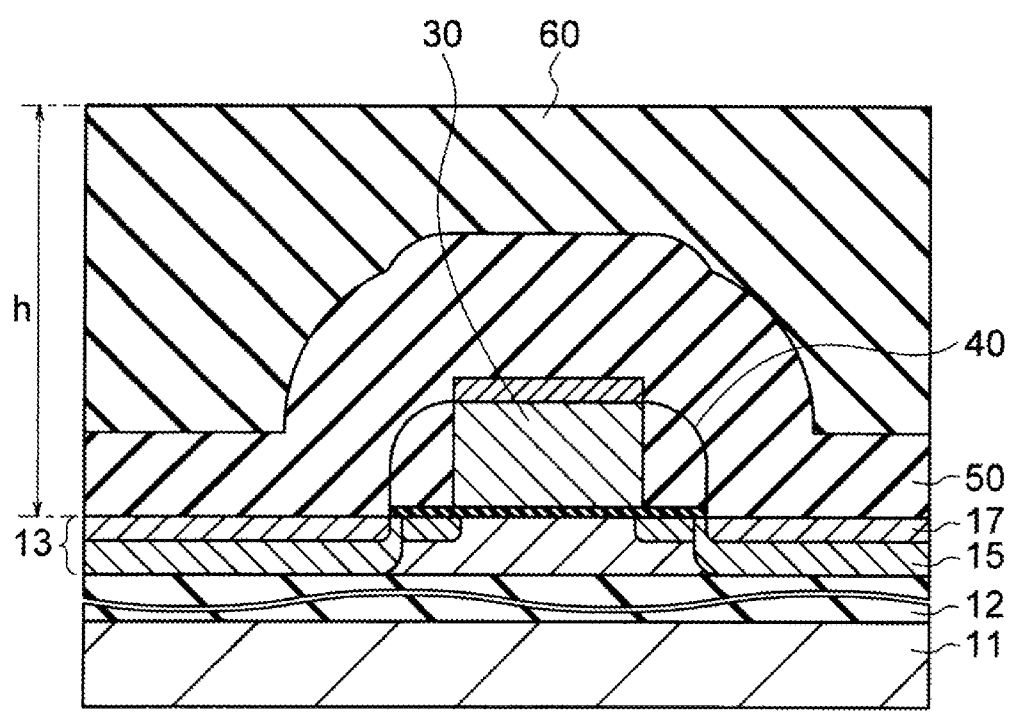
FIG. 8 is a cross-sectional view depicting a process of forming an interlayer insulating film.

FIG. 8 is a cross-sectional view showing a forming of the interlayer insulating film 60. After the forming the conformal insulating film 50, the interlayer insulating film 60 is formed. The upper surface of the interlayer insulating film 60 is planarized so that the height h from the surface of the SOI layer 13 to the upper surface of the interlayer insulating film 60 is approximately 500 nm.

Figure 9:
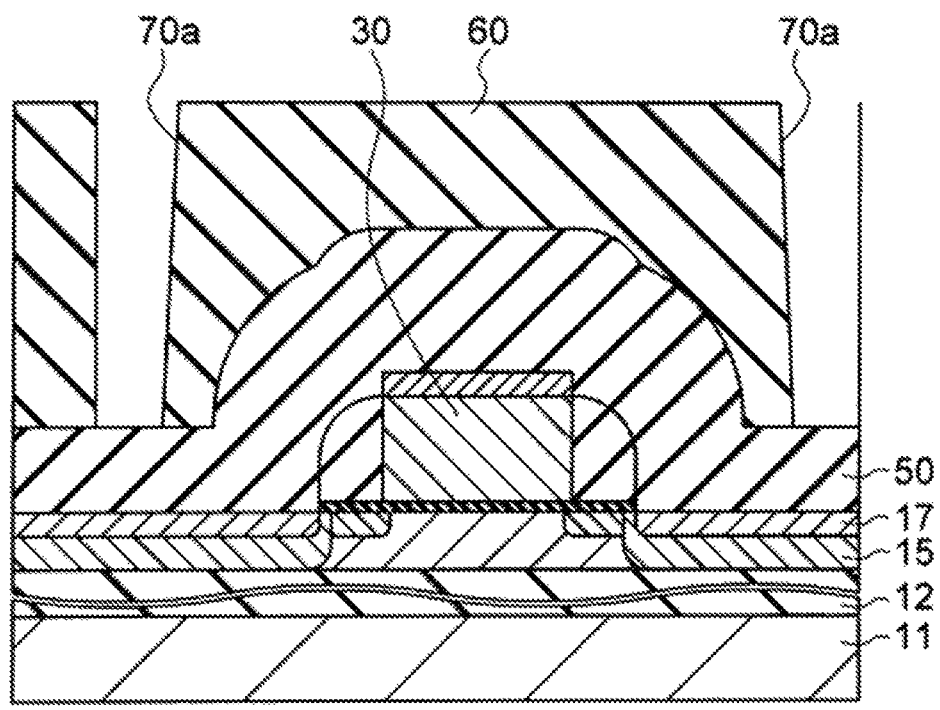
FIG. 9 is a cross-sectional view depicting a process of forming contact holes.

The FIG. 9 is a cross-sectional view showing a forming of contact holes. After forming the interlayer insulating film 60, the contact holes 70a are forming by RIE (reactive ion etching). At the same time, contact holes (not specifically depicted in FIG. 9) for forming the contact plugs 73 (see FIG. 3) are formed. The depth of the contact holes for the contact plugs 73 is less than that of the contact holes 70a. These contact holes which pass through the interlayer insulating film 60 are terminated at the conformal insulating film 50. That is, the conformal insulating film 50 serves as an etch stop film (etch stopper) and enables the formation of contact holes having different depths in the same etch processing.

Figure 10:
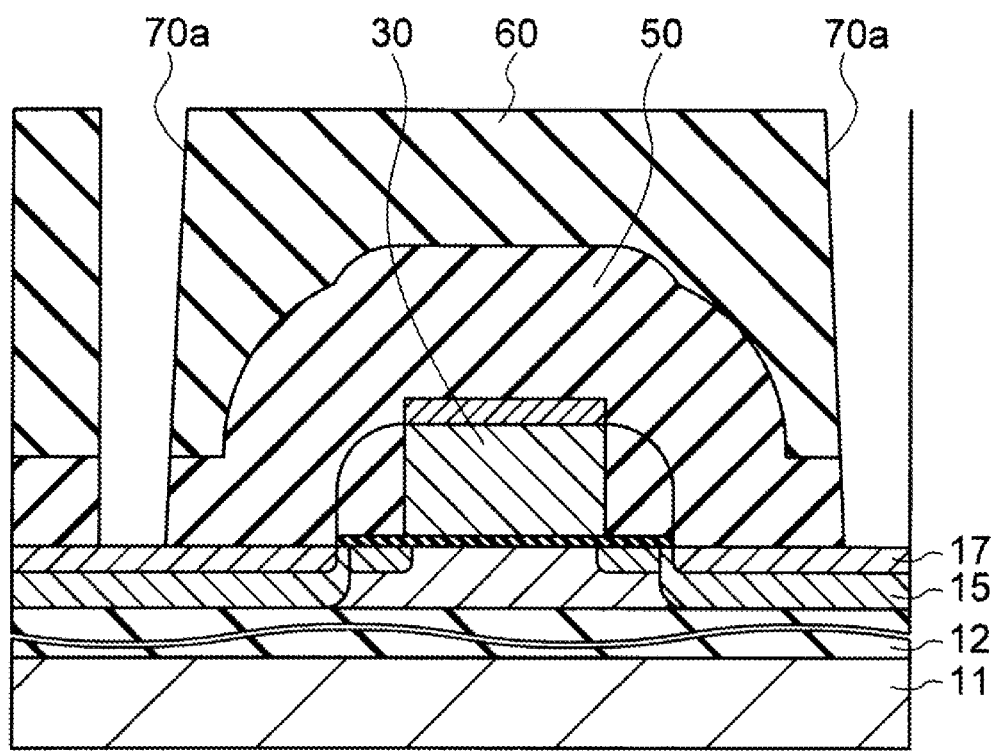
FIG. 10 is a cross-sectional view depicting a process of forming the contact holes passing through the conformal insulating film.

FIG. 10 is a cross-sectional view forming of the contact holes 70a passing through the conformal insulating film 50. The contact holes 70a are formed through the conformal insulating film 50 using different etch conditions than the conditions used for etching through the interlayer insulating film 60.

Figure 11:
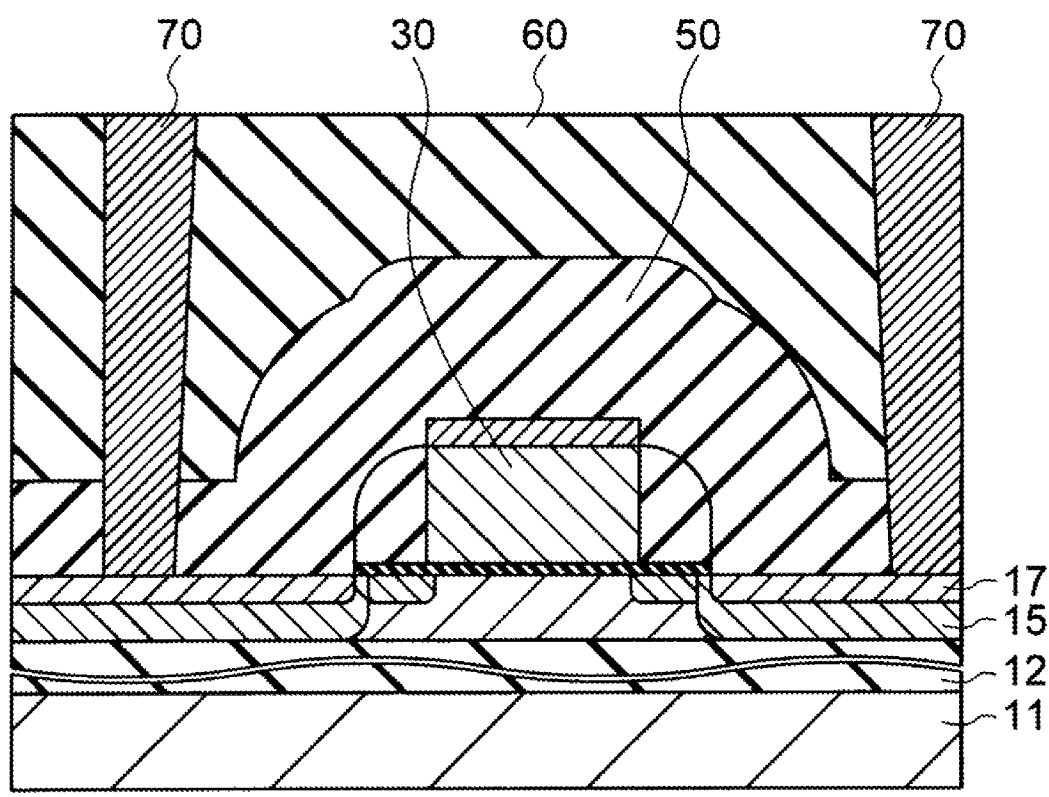
FIG. 11 is a cross-sectional view depicting a process of forming the contact plugs

FIG. 11 is a cross-sectional view showing forming of the contact plugs 70. The contact plugs 70 are formed by filling a conductive material, such as a metal, into the contact holes 70a. The length Lsg from the side surface of the gate electrode 30 to the contact plug 70 (refer to FIG. 2) is approximately 200 nm. This length Lsg is equivalent to the length from the end portion of the gate electrode to the end portion of the drain electrode or from the end portion of the gate electrode 30 to the end portion of the source electrode. Thereafter, the wiring 71 is formed as shown in FIG. 2. The contact plugs 73 and the body electrodes 77 are also formed by the conductive material used to fill the contact holes.

As described above, the semiconductor device 1 of the radio frequency switch according to the present embodiment includes the conformal insulating film 50 serving as a stress liner film in addition to a function as the etching stopper film. The conformal insulating film 50 as stress liner film provides the tensile stress in the current direction of the channel region 14a. Thereby, an electron mobility of the channel region 14a increases and the on-resistance of the semiconductor device 1 decreases. Thus, the insertion loss of the radio frequency signal can be reduced.

When the conformal insulating film 50 serves only as the etching stopper film, the minimum required thickness is approximately 30 nm to 60 nm for usual etch conditions. But, the radio frequency switch according to the present embodiment uses the conformal insulating film 50 as the stress liner film as well as an etch stop layer. In general, the greater the thickness of the stress liner film is, the greater the tensile stress applied with the channel region 14a will be. Therefore, a conformal insulating film 50 with a thickness of 70 nm gives the channel region 14a a greater tensile stress.

Also, in the semiconductor device 1 including the n-type MOSFET with a first semiconductor layer 14, that is, a body layer at a floating potential, there is a case where a parasitic bipolar operation occurs by increasing the body potential when a voltage is applied between the source and the drain. Therefore, the first semiconductor layer 14 is electrically connected to the outside through the P+ region 18, the body electrodes 77, and the wiring 78 and a body current (by holes) flows along the longitudinal direction of the gate electrode 30. Thereby the voltage of the first semiconductor layer 14 is capable of being controlled. A body resistance is primarily affected with the first semiconductor layer 14 provided along the longitudinal direction of the gate electrode 30. For example, when the gate length of the gate electrode 30 is shorter than 100 nm, the length of the semiconductor layer 14 along the gate length direction is shorter, too. That may lead to increases of the body resistance and the body voltage. Therefore, in the present embodiment, the gate length of the gate electrode 30 is longer than 100 nm.

Generally, a hole mobility is decreased while the electron mobility is increased by the tensile stress applied in the current direction x. Decreasing the hole mobility leads to increasing the body resistance. But in the present embodiment, the conformal insulating film 50 gives an uniaxial tensile stress parallel to the channel current direction x and perpendicular to the body current direction. Therefore, the mobility of the holes as body current carriers is not substantially affected by the tensile stress applied in the current direction x. That is, the structure of the radio frequency switch whose the body current is perpendicular to the channel current, does not result in an increase in the body resistance due to a decrease in the mobility of the holes as the body current carriers. Accordingly, the withstand voltage drop caused by a parasitic bipolar effect is not substantially increased by an increase of the body voltage of the semiconductor device 1 (n-type MOSFET). As a result, permissible input power is secured.

An effect provided by the radio frequency switch including the semiconductor devices 1 according to the present embodiment is described in comparison to a general integrated circuit.

First, of the amount of increase in the electron mobility corresponding to the internal tensile stress of the conformal insulating film 50 of the semiconductor devices 1 is higher than that of the n-type MOSFET of the general integrated circuit. This reason is described as below.

The n-type MOSFET of a radio frequency switch operates in the linear region in which drain current is increased in proportion to a voltage between the drain and the source. That is, a peak voltage between the drain and the source of the n-type MOSFET of the radio frequency switch in on-state is not more than 100 mV. On the other hand, the n-type MOSFET of a general integrated circuit primarily operates in the saturated region in which drain current is saturated (thus substantially the same) regardless of the voltage between the drain and the source.

An electric field intensity of the channel region 14a of the n-type MOSFET during operation is higher in the saturated region than in the linear region. The higher electric field intensity (during operation in the saturation region) saturates the electron speed and thus hardly increases the electron mobility. The electric field intensity of the channel region 14a of the semiconductor device 1 (operating in the linear region) is lower than that of the n-type MOSFET in the general integrated circuit (operating in the saturated region) and the electron speed has not yet be saturated. Therefore, of the amount of increase in the electron mobility corresponding to the internal tensile stress of the conformal insulating film 50 is higher than that of the n-type MOSFET of the general integrated circuit.

The radio frequency switch according to the present embodiment is capable of increasing the electron mobility and decreasing on-resistance in the semiconductor devices 1.

Second, the stress applied to the channel region 14a by the conformal insulating film 50 is larger than that of the n-type MOSFET in the general integrated circuit. The reason is described as below.

The stress applied to the channel region 14a by the conformal insulating film 50 is proportional to a product of the internal stress and the thickness of the conformal insulating film 50. The increase in the electron mobility becomes higher as the tensile stress applied to the channel region 14a becomes larger, and the on-resistance is consequently decreased. Therefore, the thicker the thickness of the conformal insulating film 50 is, the lower on-resistance is, and the insertion loss of the radio frequency signal will be decreased.

For switching at high speed, the n-type MOSFET in the general integrated circuit is miniaturized and a distance between the sidewall insulating film and a contact plug will be short. Therefore, contact holes are difficult to form if a thick conformal insulating film is formed. As a result, the thickness of the conformal insulating film is limited in this regard, and thereby the stress that can be applied by the conformal insulating film to reduce the on-resistance is limited. The distance between the sidewall insulating film and the contact plug corresponds to a length of a stress transmitting surface along the current direction x, in which the conformal insulating film is in contact with the SOI layer.

On the other hand, high voltage is applied between the drain and the source when the n-type MOSFET of the radio frequency switch of the present embodiment is turned off. Therefore, the withstand voltage in off-state is difficult to secure and maintain when the radio frequency switch is miniaturized. In order to secure the withstand voltage, a size of the n-type MOSFET used as the radio frequency switch is required to be relatively large, for example, a gate length longer than approximately 100 nm.

According to the present embodiment, the length Ls1 from the sidewall insulating film 40 to the contact plug 70 is set so as to allow forming the relatively thick conformal insulating film 50. As the result, the stress applied to the channel region 14a by the conformal insulating film 50 can be larger, and the on-resistance is able to be reduced. Making the length Ls1 of the stress transmitting surface long thus contributes to the reduction of the on-resistance.

Third, the internal stress of the conformal insulating film 50 is applied to the channel region 14a more effectively than that of the n-type MOSFET in the general integrated circuit. This reason is described as below.

The n-type MOSFET used as the radio frequency switch is formed on the SOI substrate 10. On the other hand, the n-type MOSFET in the general integrated circuit is formed on a bulk substrate in which a buried insulating film is not provided between the silicon substrate and the semiconductor layer.

The tensile stress becomes larger as the thickness t of the conformal insulating film 50 becomes larger. In general, an effect of the tensile stress applied to the SOI substrate is higher than an effect of the tensile stress applied to the bulk substrate. That is, the internal stress of the conformal insulating film 50 is more easily transmitted to the channel region 14a on the SOI substrate than a similar layer/region disposed on a bulk substrate because usually the rigidity of the BOX layer is lower than a rigidity of the silicon layer. In other words, in the SOI substrate serves to the resist forces applied to channel region 14a by the conformal insulating film 50 less than the bulk substrate.

According to the present embodiment, the internal stress of the conformal insulating film 50 in the semiconductor device 1 is more effectively applied to the channel region 14a than that of the n-type MOSFET in the general integrated circuit and the on-resistance is able to be reduced. Especially, as the thickness of the SOI layer 13 is small, the internal stress of the conformal insulating film 50 is more effectively applied to the channel region 14a. Therefore, the thickness of the SOI layer 13 is preferable to be small, for example, it is 70 nm or less.

The sidewall insulating film 40 may have rugged (rough) portions in manufacture when the sidewall insulating film 40 is formed on the thin SOI layer 13 as described above. In this case, the tensile stress may not be effectively applied to the channel region 14a due to use a thin conformal insulating film 50. However in the present embodiment, the thickness of the conformal insulating film 50 is equal to the width Lsw of the sidewall insulating film 40 or more. Therefore, the tensile stress is able to effectively applied to the channel region 14a because the rugged portions of the sidewall insulating film 40 are fully filled by the conformal insulating film 50.

FIRST MODIFIED EXAMPLE

Figure 12:
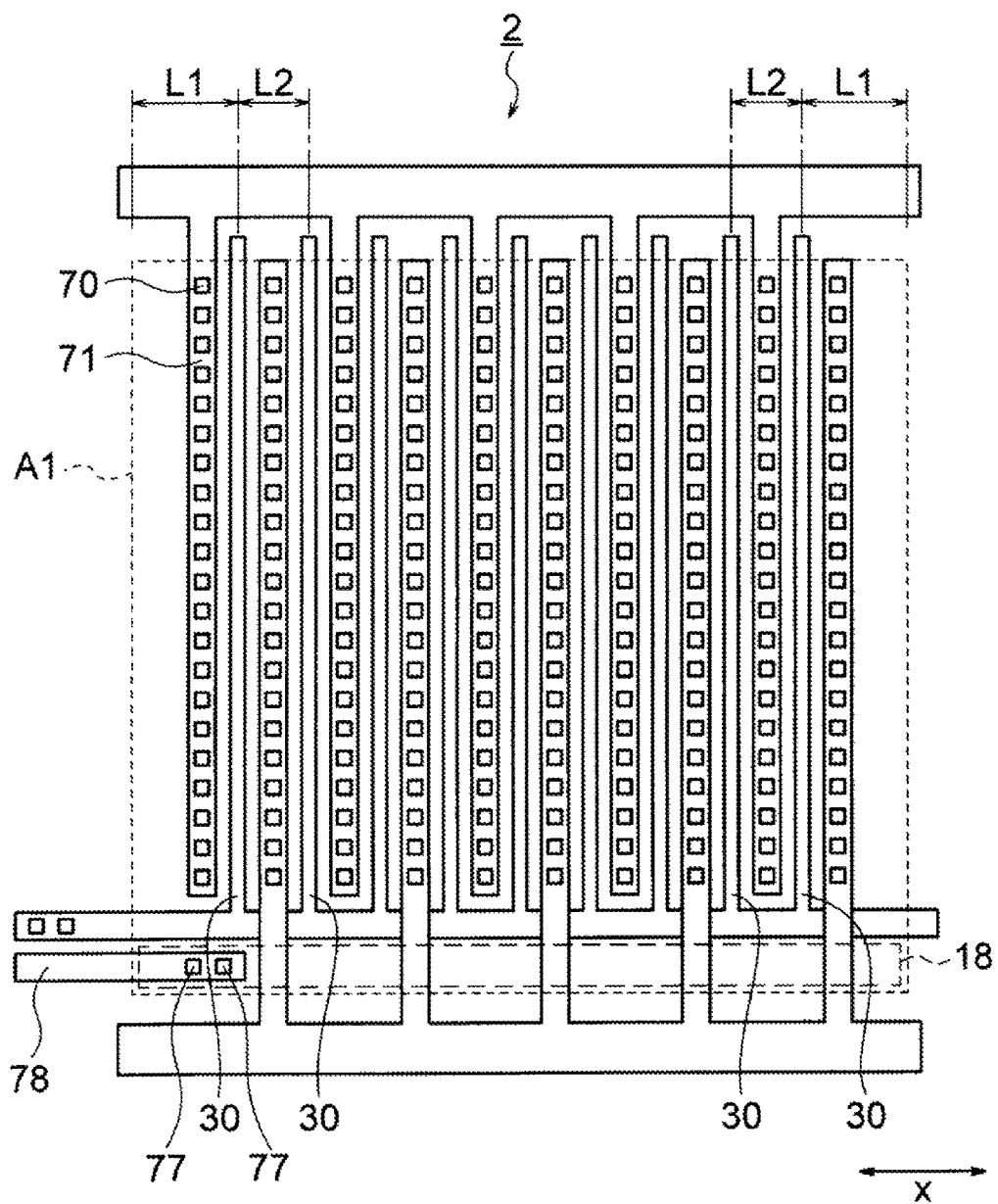
FIG. 12 is a schematic plan view showing aspects of a semiconductor device according to a first modified example of the embodiment
Figure 13:
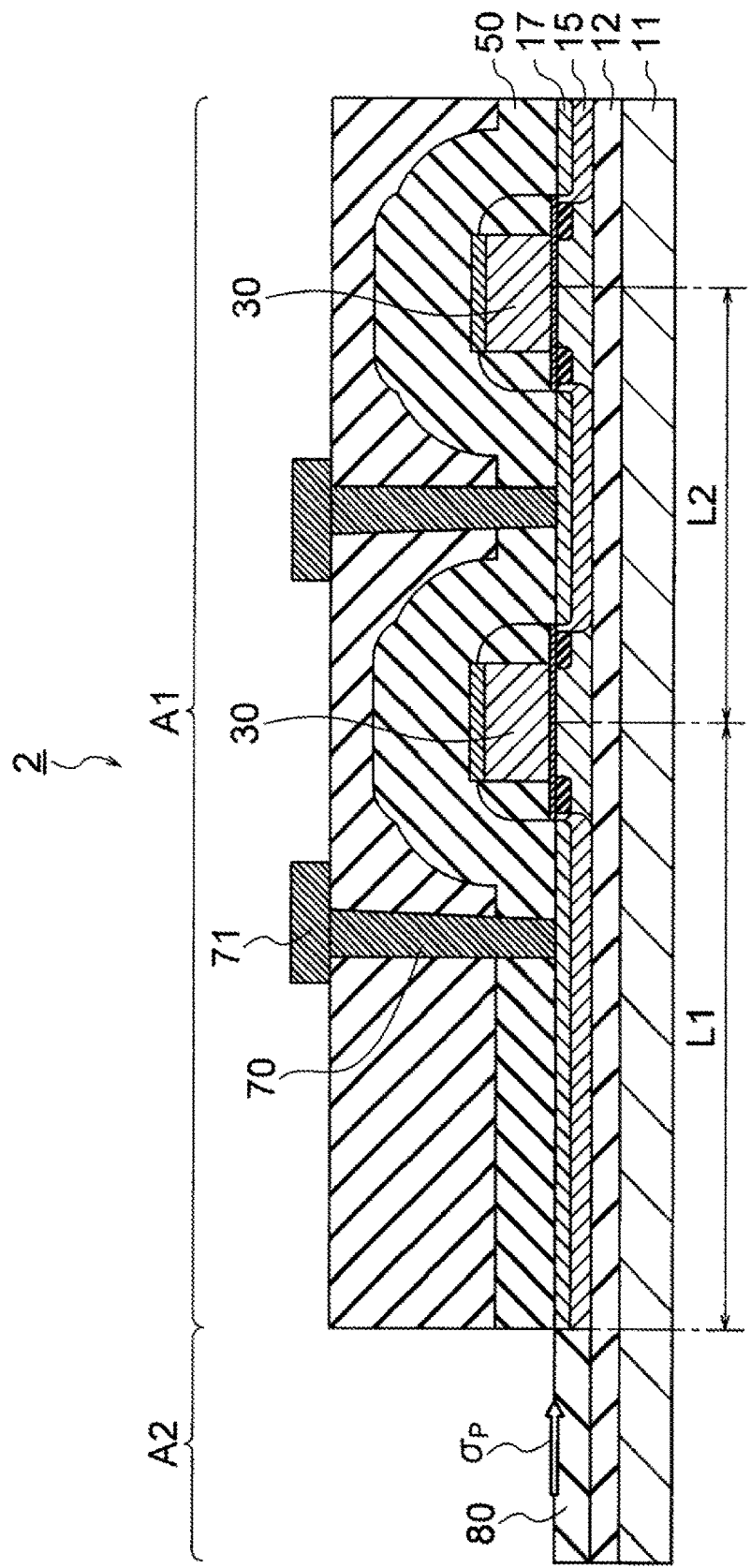
FIG. 13 is a schematic cross-sectional view showing aspects of a semiconductor device according to a first modified example of the embodiment

FIG. 12 is a schematic plan view showing a portion of the semiconductor device according to the first modified example. FIG. 13 is a schematic cross-sectional view showing a portion of the semiconductor device according to the first modified example. Components/elements found also in the previously described example will be identified with the same reference characters, and the explanations thereof may be omitted.

As shown in FIG. 12, in the semiconductor device 2, both sides portions of the active region A1 protrude in the current direction x by at least a width of the gate electrode from the outermost wiring 71 in the plan view. In other words, a length L1, in the current direction x, from a center of an outermost gate electrode 30 which are arranged at either side of the plurality of gate electrodes to a lateral edge portion of the active region A1 is longer than a pitch L2 between the centers of adjacent gate electrodes 30.

Also, as shown in FIG. 13, a STI (Shallow trench isolation) layer 80 in an inactive region A2 of the semiconductor device 2 is formed on the BOX layer 12 and generates a compressive stress σP. A direction of the compressive stress σP is opposed to the direction of the tensile stress applied to the channel region 14a. Therefore, the tensile stress applied to the channel region 14a located immediately below the outermost gate electrodes 30 (first electrode) may be cancelled or reduced by the compressive stress σP to lower than the tensile stress applied to the other channel region 14a located immediately below the interior gate electrodes 30 (i.e., non-outermost gate electrodes 30). In this case, the on-resistance characteristic of the various gate electrodes 30 may be non-uniform.

However, in this first modified example, the active region A1 is expanded toward the STI layer 80 so as to limit or reduce the compressive stress σP applied to even the outermost gate electrodes 30 by the STI layer 80. Consequently, uniform on-resistance amongst the plurality of gate electrodes 30 can be provided or improved.

SECOND MODIFIED EXAMPLE

Figure 14:
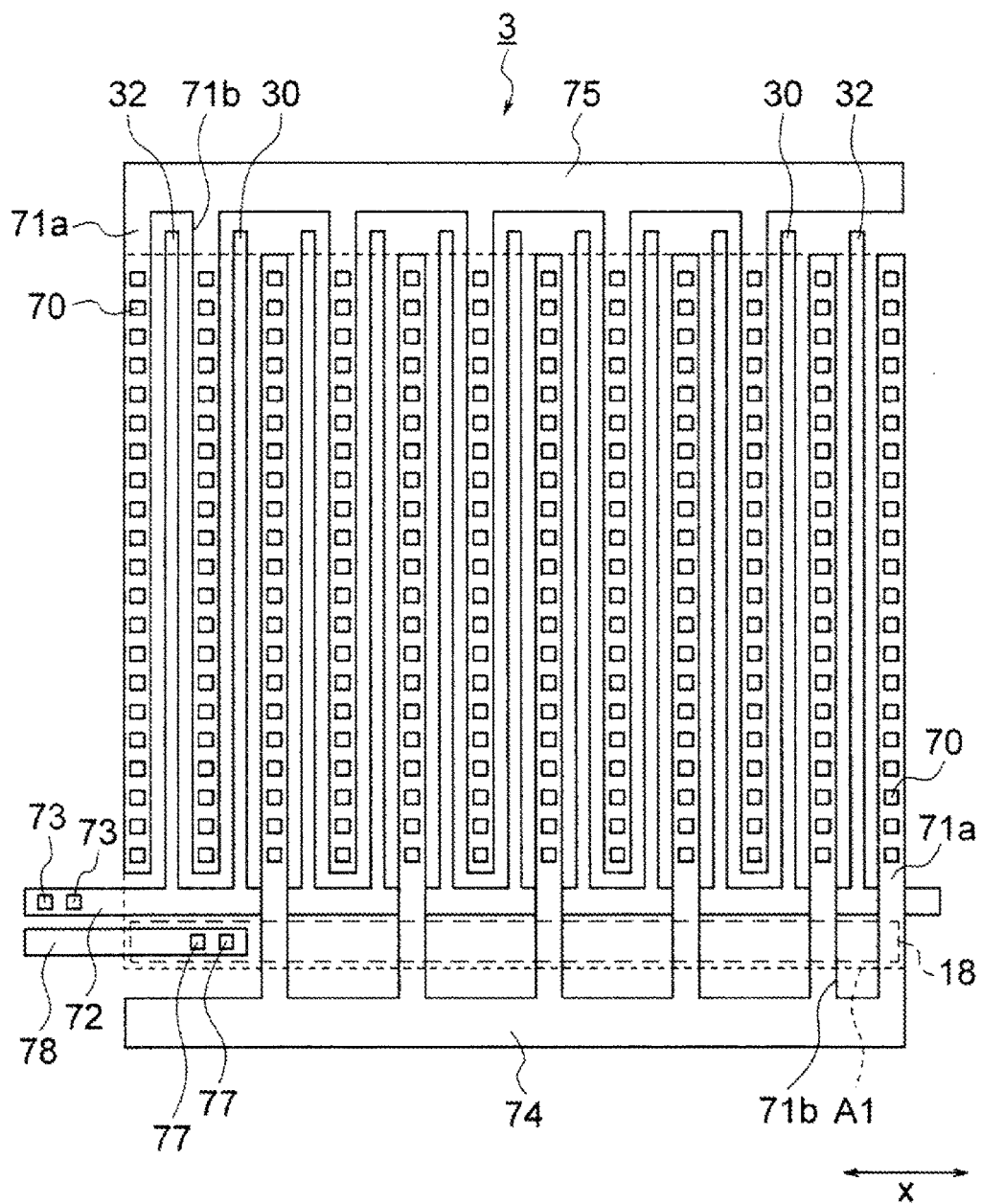
FIG. 14 is a schematic plain view showing aspects of a semiconductor device according to a second modified example of the embodiment.

FIG. 14 is a schematic cross-sectional view showing a portion of the semiconductor device according to the second modified example. Hereinafter, such component/elements found also in the previously described example embodiment will be identified with the same reference characters, and the explanations thereof may be omitted.

As shown in FIG. 14, the wiring 71a located at outermost edge of the active region A1 and the wiring 71b adjacent to the wiring 71a are commonly connected to the wiring 74 or the wiring 75. Therefore, a voltage of the wiring 71a is equal to a voltage of the wiring 71b. Also a current does not flow between the wiring 71a and the wiring 71b when a voltage is applied to the gate electrode 32 located between the wiring 71a and the wiring 71b. That is, this gate electrode 32 is used as a dummy electrode in this second modified example.

As in the first modified example described above, in the second modified example, the outermost gate electrodes (gate electrodes 30 in the first modified example; gate electrodes 32 in the second modified example) rows may receive compressive stress σP from the STI layer 80. If the gate electrode 32 was used as an active electrode (i.e., like a gate electrode 30), the tensile stress applied to the channel region 14a located immediately below the gate electrode 32 might be lower than that applied to the channel regions 14a below the gate electrodes 30. In this case, on-resistance characteristics of the gate electrode 32 and the gate electrode 30 might not be uniform.

However, in the second modified example, the gate electrode 32 is used as the dummy electrode. Therefore, the channel regions 14a below each gate electrodes 30 inside the gate electrodes 32 will be somewhat shielded from the compressive stress σP and thus there may be a more uniform tensile stress applied to the active electrodes (gate electrodes 30). Consequently, uniformity in the on-resistance of the active electrodes (gate electrodes 30) is provided or improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency switch, comprising:
a switch circuit having a plurality of switchable radio frequency (RF) signal pathways, each switchable RF signal pathway comprising a plurality of n-type MOSFETs connected in series within an active region; and
a control circuit configured to control a conduction state of the plurality of switchable RF signal pathways, wherein
each n-type MOSFET comprises:
a body region between a source region thereof and a drain region thereof;
a gate electrode on the body region;
a body electrode on an end side of the active region beyond gate electrode wiring in a gate length direction, the body electrode configured to flow a body current along a longitudinal direction of the gate electrode; and
a silicon nitride film having a tensile internal stress parallel to a channel current direction and covering the source layer, the drain layer, and the gate electrode.

2. The radio frequency switch according to claim 1, wherein the each n-type MOSFET further includes a sidewall insulating film disposed on a sidewall of the gate electrode, and a thickness of the silicon nitride film from the sidewall is equal to or greater than a width of the sidewall insulating film.

3. The radio frequency switch according to claim 1, further comprising:
a wiring in a comb shape with gate electrodes of the plurality of n-type MOSFETs being between adjacent portions of the comb shape.

4. The radio frequency switch according to claim 3, wherein gate electrodes of n-type MOSFETs of the plurality of n-type MOSFETs that are located at outermost positions in the comb shape are dummy gate electrodes.

5. The radio frequency switch according to claim 3, wherein a distance from a center of the gate electrodes located at both sides of the gate electrode rows to a peripheral portion of the active region in the current direction is longer than a pitch between the centers of the gate electrodes.

6. The radio frequency switch according to claim 1, wherein the silicon nitride film has tensile internal stress in a range of 1 GPa to 3 GPa.

7. The radio frequency switch according to claim 1, wherein the silicon nitride film has a thickness of 70 nm or more.

8. The radio frequency switch according to claim 1, wherein the source layer, the drain layer, and the body region are provided on a silicon-on-insulator (SOI) layer.

9. The radio frequency switch according to claim 8, wherein the SOI layer has a thickness of 70 nm or less.

10. The radio frequency switch according to claim 1, wherein a peak voltage between the drain and the source of each n-type MOSFET in the plurality of n-type MOSFETs is 100 mV or less when at least one n-type MOSFET of the plurality of n-type MOSFETs is in on-state.

11. The radio frequency switch according to claim 1, wherein a gate length of the gate electrode of each n-type MOSFET in the plurality of n-type MOSFETs is 100 nm or more.

\* \* \* \* \*